United States Patent
Yoshida et al.

(10) Patent No.: US 6,584,683 B2
(45) Date of Patent: Jul. 1, 2003

(54) MOUNTING ELECTRONIC COMPONENT METHOD AND APPARATUS

(75) Inventors: Noriaki Yoshida, Ikeda (JP); Yoshihiro Mimura, Izumi (JP); Shozo Fukuda, Nakakoma-gun (JP); Kanji Hata, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 53 days.

(21) Appl. No.: 09/769,515

(22) Filed: Jan. 26, 2001

(65) Prior Publication Data

US 2001/0049876 A1 Dec. 13, 2001

Related U.S. Application Data (63) Continuation-in-part of application No. 09/171,182, filed as application No. PCT/JP97/01309 on Apr. 16, 1997.

(30) Foreign Application Priority Data

Apr. 18, 1996 (JP) .............................................. 8-95770

(51) Int. Cl.[7] .................................................. H05K 3/30
(52) U.S. Cl. .......................................... 29/834; 29/832
(58) Field of Search .......................... 29/834, 832, 740, 29/743

(56) References Cited

U.S. PATENT DOCUMENTS

| | | | |
|---|---|---|---|
| 4,981,372 A | 1/1991 | Morimoto et al. | |
| 5,038,380 A | 8/1991 | Morimoto et al. | |
| 5,212,881 A | * | 5/1993 | Nishitsuka et al. ........... 29/720 |

FOREIGN PATENT DOCUMENTS

EP 0 650 319 10/1994

OTHER PUBLICATIONS

"Machine Vision Technique for Increasing the Integrity of Chip Alignment Data", IBM Technical Disclosure Bulletin, vol. 34, No. 10B, Mar. 1, 1992, pp. 129–131.

Lister P. et al., "Next–Generation Vision Algorithms for SMT Assembly", Electronic Packaging and Production, vol. 32, No. 2, Feb. 1, 1992, pp. 48–50.

* cited by examiner

Primary Examiner—Edward K. Look
Assistant Examiner—Kimya N McCoy
(74) Attorney, Agent, or Firm—Wenderoth, Lind & Ponack, L.L.P.

(57) ABSTRACT

In an electronic component mounting method and apparatus, an electronic component is taken out from an electronic component feed position, a posture of the component is detected, and the component is mounted on a board based on a detected result. The method includes acquiring image data with a camera of the component from the feed position, processing acquired image data with a plurality of algorithms for detecting postures of components, and detecting a posture of the component.

12 Claims, 5 Drawing Sheets

PRIOR ART

Fig. 3

PRIOR ART

Fig. 4

MOUNTING ELECTRONIC COMPONENT METHOD AND APPARATUS

The present application is a continuation in part of application Ser. No. 09/171,182, filed on Oct. 14, 1998 which is a national phase application of International Application No. PCT/JP97/01309 filed on Apr. 16, 1997.

TECHNICAL FIELD OF THE INVENTION

The present invention relates to an electronic component mounting apparatus and a method for mounting electronic components onto boards such as printed boards, boards of liquid crystal displays or plasma display panels with the electronic component mounting apparatus.

BACKGROUND OF THE INVENTION

An electronic component mounting apparatus is generally constituted so as to mount electronic components on printed boards after taking the components from a feed position by using nozzles. According to the prior art method for mounting the components, a posture of the taken component is detected by a recognition device, thereby recognizing the component. A recognition process will be depicted below with reference to the drawings.

Figure 2:
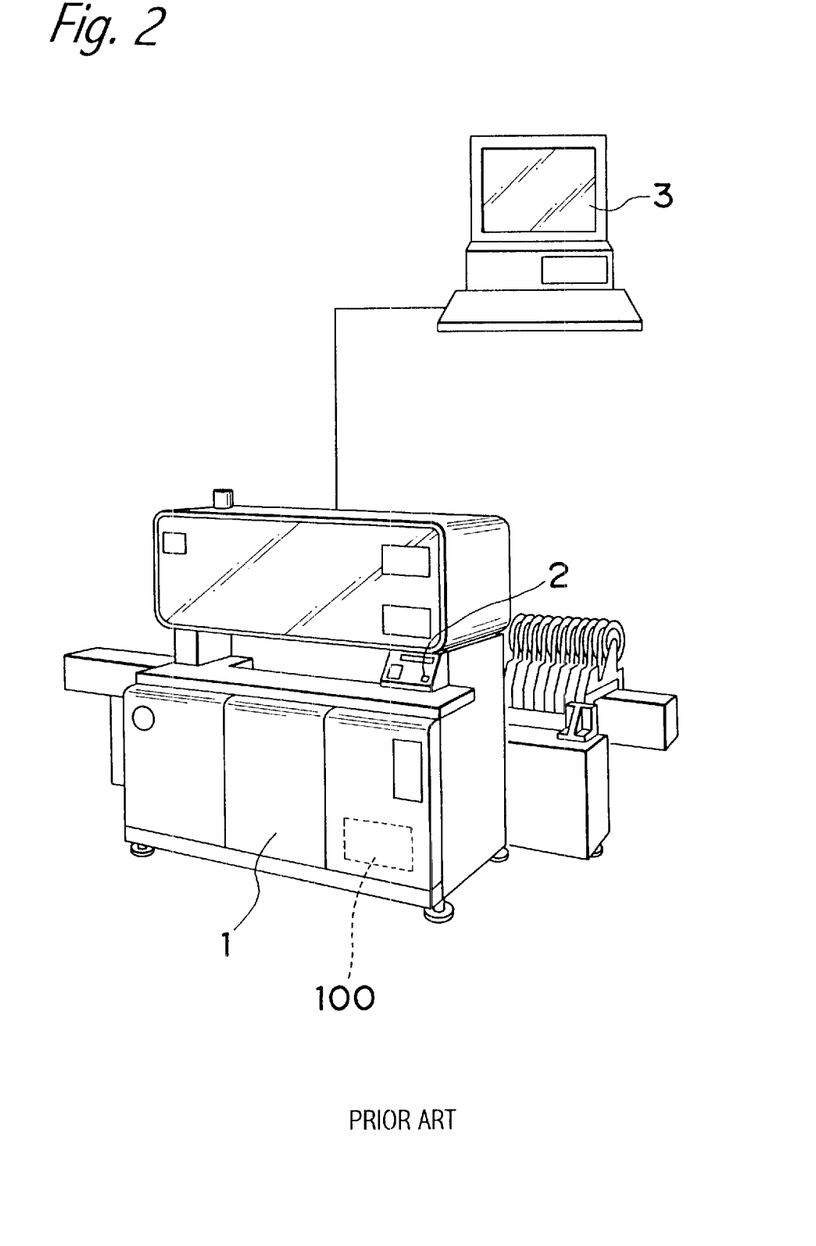
FIG. 2 is a schematic view of an electronic component mounting apparatus utilizing the electronic component mounting method of the embodiment.

FIG. 2 shows an electronic component mounting apparatus provided with a monitoring system for monitoring an operating state of the apparatus. As shown in FIG. 2, the electronic component mounting apparatus has a main body 1, an operation panel 2 and a host computer 3. Unattended operation has been common to improve the efficiency of the apparatus when mounting the electronic components. Component recognition data is required for the mounting apparatus to recognize the electronic components during mounting. The component recognition data was produced and selected by an operator of the mounting apparatus using the operation panel 2 or host computer 3 when a mounting position program was formed.

Figure 3:
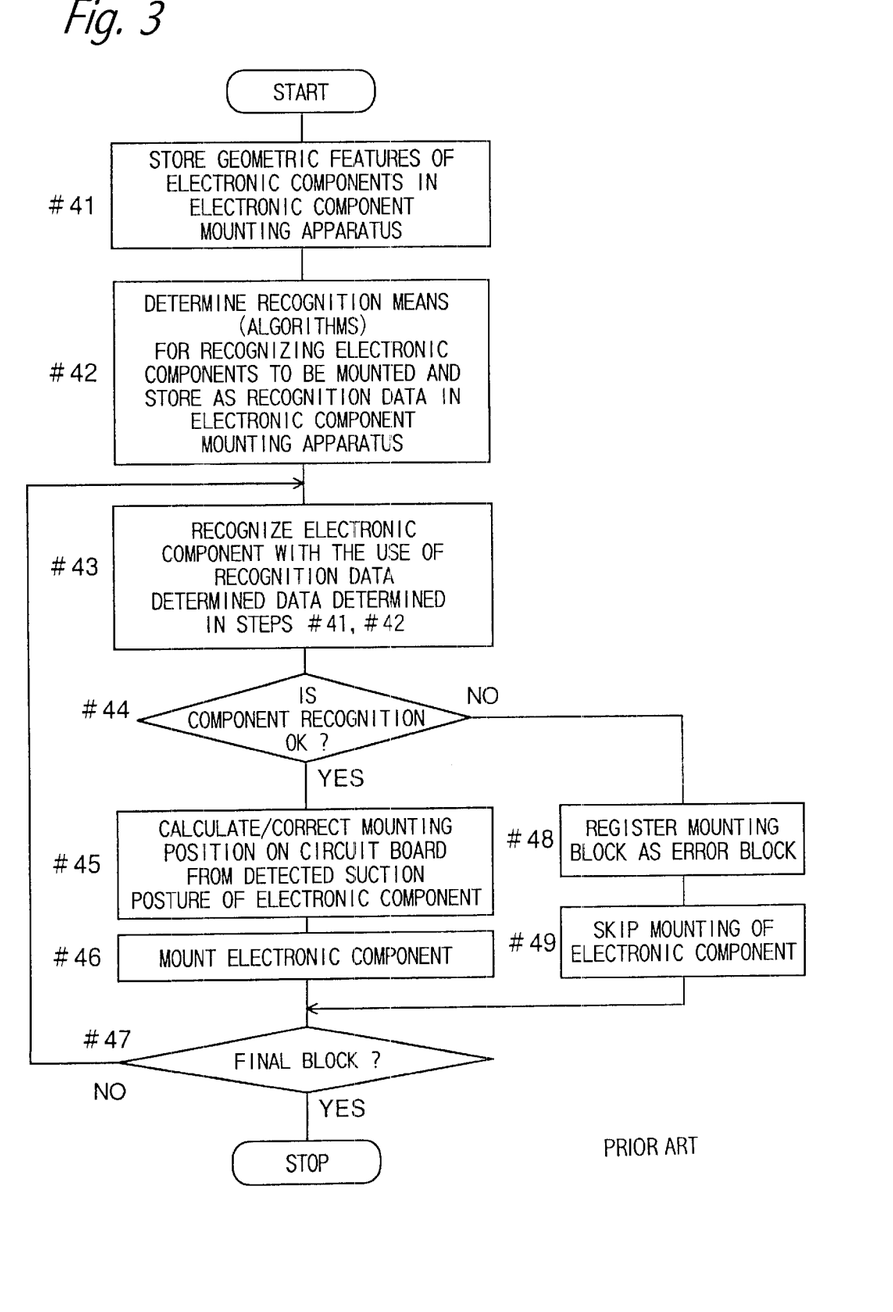
FIG. 3 is a flow chart of procedures for recognizing components according to a conventional electronic component mounting method.

FIG. 3 is a flow chart of procedures for forming and selecting the aforementioned component recognition data in the mounting apparatus utilizing the conventional mounting method. In mounting the electronic components by the mounting apparatus, the operator manipulates the mounting apparatus as follows.

Referring to FIG. 3, based on an input of the operator, an outside dimension of the electronic component, a count of leads thereof, a pitch of leads thereof, etc., as geometric features of an electronic component to be mounted, are extracted from catalog data in step #41, and stored in the electronic component mounting apparatus.

In step #42, based on input of the operator, a recognition means (algorithm) supposed to be suitable for the electronic component is selected from the various recognition means assigned to the electronic component mounting apparatus. The number of the selected algorithm and the geometric features inputted in the step #41 are registered and stored in the mounting apparatus as component recognition data.

In step #43, the electronic component is recognized with the use of the component recognition data registered in steps #41 and #42.

In step #44, it is decided whether or not the component recognition is acceptable (OK or NO).

When it is decided in step #44 that the component recognition is acceptable, a difference between a normal mounting posture at a mounting position of the component on the board and a detected suction posture of the component is calculated and corrected in step #45.

Next, in step #46, the component is mounted on the board at the corrected mounting position by the mounting apparatus.

Thereafter, in step #47, it is decided whether or not any components to be mounted are left, that is, whether or not a mounting block is a last one. When the mounting block is the last one, the mounting operation is completed. When the mounting block is not the last one, the program returns to step #43 in order to perform the next mounting operation of the component in a next mounting block.

On the other hand, when the component recognition is not acceptable in step #44, the mounting block to which the component belongs is registered as an error block in step #48.

Next, in step #49, the mounting operation of the component in the mounting block is skipped and the program goes to step #47.

In such a manner, based on the data from the teaching process of steps #41 and #42 through the input of the operator, the mounting process in steps #43 to #47 is performed. In the mounting process, the recognition data of the components in the teaching process are used to confirm the component recognition result and when the confirmed result is acceptable, the selected recognition data is used. When the confirmed result is not acceptable, the mounting operation of the component is skipped and the next component mounting operation is performed carrying out a continuous mounting operation.

The prior art mounting method based on the above-described formation/registration method of the component recognition data in the electronic component mounting apparatus has the following drawbacks.

1) In the teaching process of forming/registering the component recognition data in the electronic component mounting apparatus, since the operator identifies and judges the electronic component to be mounted, the component recognition data varies for every operator. As a result, even the same electronic component cannot be mounted with high recognition accuracy.

2) Since only one recognition algorithm is selected and executed for each electronic component recognition by the operator in the mounting process, if a surface color is minutely different among lots of electronic components or the electronic components shine differently due to a gloss difference of the leads, a recognition efficiency is extremely decreased, leading to an increase of wrong recognitions.

SUMMARY OF THE INVENTION

Accordingly, an object of the present invention is to provide an electronic component mounting method and apparatus whereby electronic components with the same geometric features can be recognized/mounted with high accuracy and high recognition efficiency without setting an algorithm for every electronic component, thereby greatly decreasing wrong recognitions, while eliminating the need for an operator to set/control component recognition data.

In accomplishing these and other aspects, according to a first aspect of the present invention, there is provided an electronic component mounting method in which an electronic component is taken from an electronic component feed position, a posture of the component is detected, and the component is mounted on a board based on a detected result. The method includes acquiring image data of the component taken from the feed position by a camera, processing acquired image data with a plurality of algorithms for detecting postures of components, and detecting a posture of the component.

According to a second aspect of the present invention, there is provided an electronic component mounting method as defined in the first aspect, further including comparing each detected result related to the posture of the component obtained in the plurality of algorithms with geometric features of the component stored in the electronic component mounting apparatus. The second aspect also includes selecting one result from the detected results and correcting data of a mounting position of the component on the board based on the selected result and mounting the component at the mounting position of the board.

According to a third aspect of the present invention, there is provided an electronic component mounting method as defined in the second aspect, wherein in selecting the one result from the detected results, an area value of the component obtained from an outside dimension of the component is compared with an area value of the component obtained from the detected result of the algorithm, thereby selecting the result of the one algorithm correctly recognizing the geometric shape of the component.

According to a fourth aspect of the present invention, there is provided an electronic component mounting method as defined in the second aspect, wherein in selecting the one result from the detected results, a length of an outline of the component obtained from an outside dimension of the component is compared with a length of an outline of the component obtained from the detected result of the algorithm, thereby selecting the detected result of the one algorithm correctly recognizing the geometric shape of the component.

According to a fifth aspect of the present invention, there is provided an electronic component mounting apparatus in which an electronic component is taken from an electronic component feed position, a posture of the component is detected, and the component is mounted on a board based on a detected result. The apparatus includes a camera for acquiring image data of the component from the feed position and a control unit for processing acquired image data with a plurality of algorithms for detecting postures of components, and detecting a posture of the component.

According to a sixth aspect of the present invention, there is provided an electronic component mounting apparatus as defined in the fifth aspect, wherein the control unit compares each detected result related to the posture of the component obtained in the plurality of algorithms with geometric features of the component stored in the electronic component mounting apparatus, thereby selecting one result from the detected results and correcting data of a mounting position of the component on the board based on the selected result and controls to mount the component at the mounting position of the board.

According to a seventh aspect of the present invention, there is provided an electronic component mounting apparatus as defined in the sixth aspect, wherein in selecting the one result from the detected results, the control unit compares an area value of the component obtained from an outside dimension of the component to an area value of the component obtained from the detected result of the algorithm, thereby selecting the result of the one algorithm correctly recognizing the geometric shape of the component.

According to an eighth aspect of the present invention, there is provided an electronic component mounting apparatus as defined in the sixth aspect, wherein in selecting the one result from the detected results, the control unit compares a length of an outline of the component obtained from an outside dimension of the component to a length of an outline of the component obtained from the detected result of the algorithm, thereby selecting the detected result of the one algorithm correctly recognizing the geometric shape of the component.

According to the aspects of the present invention, positional data for mounting of an electronic component is calculated and stored based on the posture of the electronic component detected by the recognition process and geometric features of the electronic component held, such as by being stored, in the electronic component mounting apparatus. The algorithm for detecting postures of components is not set for each one of the electronic components of the same geometric features.

As a result, the electronic components can be recognized/mounted with high accuracy and high recognition efficiency, a count of wrong recognitions of components is greatly reduced and the need for the operator to set/control the component recognition data is eliminated.

In the above-described method, when the posture of the electronic component from the feed position, taken by the nozzle or a chuck to be mounted onto the printed board or display panel boards is detected by the recognition process, the image of the electronic component is processed with the use of a plurality of algorithms for detecting postures of components. Each result is then compared with the held, i.e. such as stored, geometric features of the electronic component, and one result is selected from a plurality of results. The data of the mounting position of the electronic component is then corrected based on the selected result.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Before the description of the present invention proceeds, it is to be noted that like parts are designated by like reference numerals throughout the accompanying drawings.

The electronic component mounting method and apparatus in one embodiment of the present invention will be specifically described with reference to the drawings.

Figure 1:
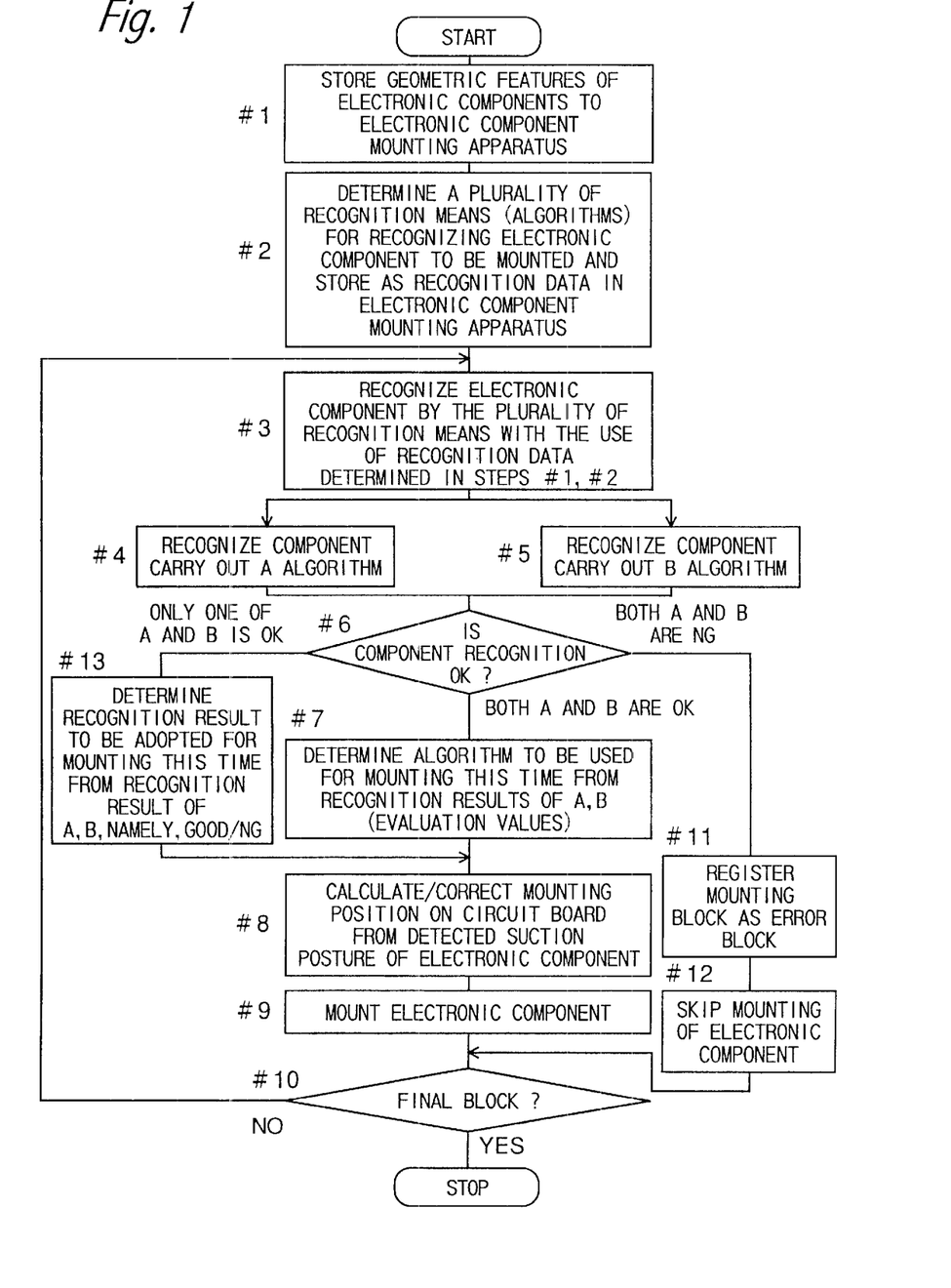
FIG. 1 is a flow chart of steps for recognizing components in an electronic component mounting method of an embodiment of the present invention.
Figure 4:
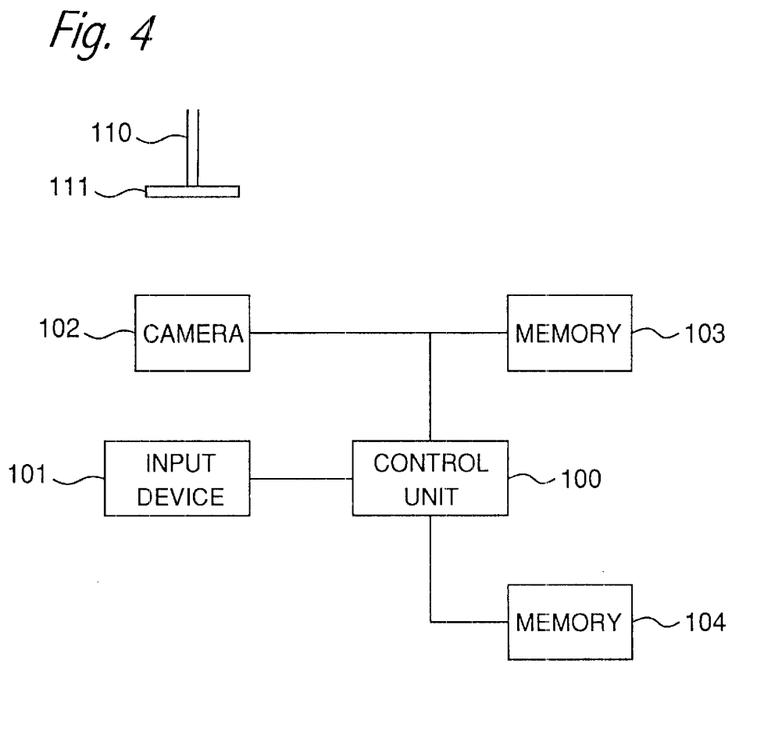
FIG. 4 is a block diagram of a recognition device of the apparatus of the embodiment.

FIG. 1 is a flow chart of procedures for forming component recognition data when an electronic component is mounted by applying the electronic component mounting method of the embodiment, and for recognizing the electronic component with the use of the data. FIG. 4 is a block diagram of a recognition device of the apparatus for carrying out the method.

In step #1 of FIG. 1, outside dimensions, counts of leads, pitches of leads, etc., of electronic components are extracted as geometric features of the electronic components to be mounted from catalog data, and then the geometric features are stored in a memory 104 of a recognition device 150 of the electronic component mounting apparatus, with an input device 101 such as a keyboard or a mouse through operations of an operator, as shown in FIG. 4.

In step #2, through input of an operator, a plurality of candidates for a recognition means (algorithms for detecting postures of the electronic components) are preliminarily assigned to the mounting apparatus and are considered to be suitable for the electronic components to be mounted based on a number of leads and colors of packages of the components, and then registered as component recognition data in the memory 104 of the recognition device 150 in the mounting apparatus of FIG. 4.

In step #3, the electronic component is recognized by the mounting apparatus with the use of the component recognition data registered in steps #1 and #2. In this step, image data of the electronic component 111 being suctioned by a nozzle 110 of the mounting apparatus is acquired by a camera 102, and the image data is stored in each of a plurality of internal memory sections of a memory 103 of the recognition device 150 inside of the mounting apparatus of FIG. 4.

Next, in steps #4 and #5, the image data of the component respectively stored in the memory sections of the memory 103 are processed with different algorithms stored in the memory 104 which were selected in step #2 by the control unit 100 of the recognition device 150 at the same time. In order to perform this processing, the control unit 100 has processing components for performing simultaneous processing. As an example, in FIG. 1, the image data is processed by executing an algorithm A in step #4 at the same time as the image data is processed by executing an algorithm B in step #5.

In step #6, each recognition result of the electronic component, with the use of the plurality of algorithms selected in step #3 and executed in steps #4 and #5, is compared with geometric features of the electronic component stored in step #1, by the control unit 100, to evaluate the recognition results.

In such a manner, the recognition device 150 of the mounting apparatus generally comprises the camera 102, the memories 103 and 104, the control unit 100, and the input device 101.

The plurality of recognition algorithms are executed to recognize the electronic component in steps #4 and #5. Therefore, a plurality of different recognition results are outputted from the recognition device 150, making it necessary to select an optimum recognition result among the plurality of recognition results in accordance with an evaluation value by the control unit 100.

In one way of calculating the above mentioned evaluation value, an area value of the electronic component obtained from the outside dimension is compared with an area value of the electronic component obtained from the recognition result, the algorithm correctly recognizing the geometric shape of the electronic component is then selected. In a different way, a length of an outline of the electronic component obtained from the outside dimension of the electronic component is compared with a length of the outline of the electronic component obtained from the recognition result, and the algorithm correctly recognizing the geometric shape of the electronic component is then selected.

In the manner as above, in step #6, an optimum recognition result is selected among the plurality of recognition results of the algorithms.

Should the recognition results of the algorithms A and B, respectively, executed in steps #4 and #5 fall within an allowable range in step #6, the program goes to step #7 where, based on the component recognition evaluation values calculated from the two recognition results, one algorithm is selected from the plural algorithms.

Next, in step #8, based on the recognition result of the selected algorithm, a mounting position on the board is calculated from the suction posture of the detected component and corrected by the control unit 100.

In step #9, based on the corrected mounting position, the component is mounted on the board by using the mounting apparatus under the control of the control unit 100.

Then, in step #10, it is decided whether or not any components to be mounted are left, that is, whether or not a mounting block is a last one. When the block is the last one, the mounting operation is completed. When the block is not the last one, the program returns to step #3 in order to perform the next mounting operation of the component in a next mounting block.

On the other hand, when only one of the recognition results of the algorithms A and B falls within the allowable range in step #6, it is determined that the one algorithm having the allowable recognition result is selected from the two algorithms in step #13 and the program goes to step #8.

When both of the recognition results of the algorithms A and B do not fall within the allowable range in step #6, the mounting block to which the component belongs is registered as an error block in step #11. Next, in step #12, the mounting operation of the component in the mounting block is skipped and the program goes to step #10.

In such a manner, based on the data from the teaching process of steps #1 and #2 through the input of the operator, the mounting process in steps #3 to #10 is performed. In the mounting process, the recognition data of the components in the teaching process are used to confirm the recognition results and when the confirmed result is acceptable, the selected recognition data is used. When the confirmed result is not acceptable, the mounting operation of the component is skipped and the next component mounting operation is performed carrying out a continuous mounting operation.

In the manner above, when a posture of the electronic component taken by the nozzle from a feed position to be mounted onto a printed board is detected by the recognition device, an image of the electronic component is processed in a plurality of steps with the use of the plurality of algorithms for detecting postures. Each result is compared with the stored geometric features of the electronic component and one is selected from the plurality of detection results. A mounting position of the electronic component is thus corrected based on the selected detection result.

According to the method, while the algorithm is not set for each of the electronic components of the same geometric features, the electronic components can be recognized/mounted with a high accuracy and a high recognition efficiency, so that the number of wrong recognitions, of the electronic components is remarkably reduced. At the same time, it becomes unnecessary for the operator to set/control the component recognition data.

As a result, the operator is freed from the need to limit the component recognition data for every electronic component to one of many in order to form and register the component recognition data in the electronic component mounting apparatus. The component recognition data of the electronic components with the same geometric features becomes uniform, not irregular. Even if the electronic components show a minute difference in surface color because of irregularities among the production lots of the electronic components or shine differently due to a gloss difference of the leads, etc., the recognition efficiency is prevented from deteriorating, and the recognition accuracy is improved.

The above-described algorithms for detecting the postures are various kinds of algorithms such as those in U.S. Pat. No. 4,981,372 issued to Morimoto, et al. on Jan. 1, 1991 and U.S. Pat. No. 5,038,380 issued to Morimoto, et al. on Aug. 6, 1991 as examples.

As described above, according to the present invention, when the posture of the electronic component taken from the feed position to be mounted onto the board is detected by the recognition device, the image of the electronic component is processed with the use of a plurality of algorithms for detecting postures, and one result is selected from a plurality of detection results. The mounting positional data of the electronic component is corrected based on the selected result.

Accordingly, the electronic components with the same geometric features are recognized and mounted with a high accuracy and a high recognition efficiency, without setting the algorithm for every electronic component. The electronic components can be prevented from being wrongly recognized and the operator is not required to set and control the component recognition data.

The operator is not required to limit the component recognition data to one of many for each electronic component in order to form and register the component recognition data in the electronic component mounting apparatus. Even when the electronic components show a delicate difference in surface color due to irregularities among the production lots of the electronic components or shine differently due to a difference in luster of the leads, the recognition efficiency is not decreased extraordinarily and the recognition accuracy is improved.

Here, as one example, it is supposed that there are two algorithms: a boundary detection algorithm for detecting boundaries of outer shapes of components, and an outer shape detection algorithm for performing pattern-matching to detect outer shapes of components. In a case where there are variations in outer sizes of the components, the boundary detection algorithm for detecting boundaries of outer shapes of components is used for detecting electrode sizes of the components, which is a time consuming process, while the outer shape detection algorithm is also suitable to the above case. On the other hand, in a case where the electrodes have variation in color, an outer shape detection algorithm for performing pattern-matching is used for detecting the electrode sizes of the components, which is also a time consuming process, while the boundary detection algorithm is also suitable to the above case.

Figure 5:
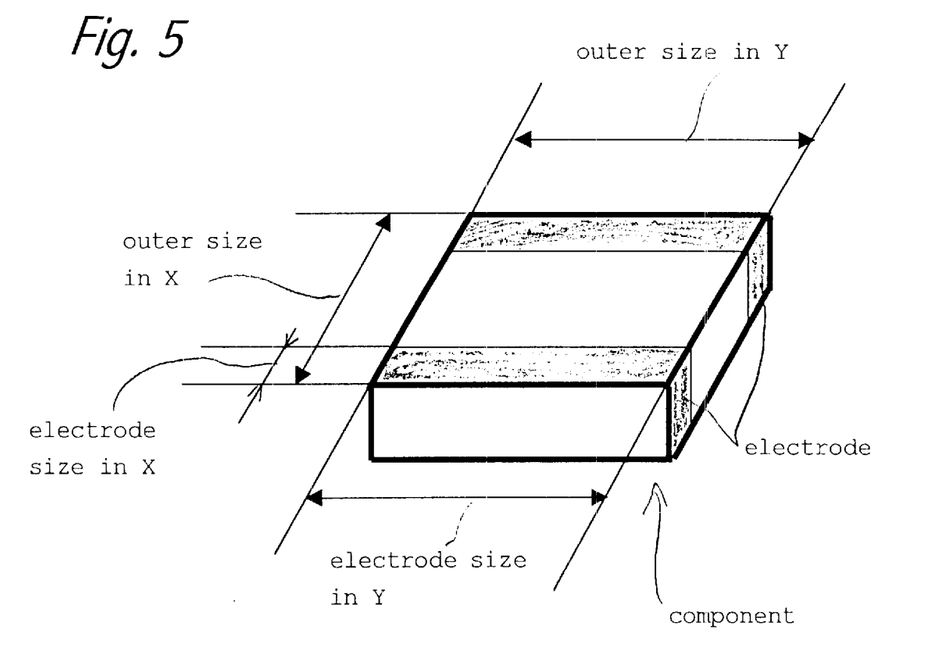
FIG. 5 is an example of a component for use by the present invention.

Therefore, after the above two kinds of algorithms are simultaneously performed on the same component, the results obtained from the two algorithms and reference sizes of an outer size and an electrode size of the component (for example, outer size of X=1.6 mm, Y=0.8 mm and electrode size of X=0.3 mm, Y=0.8 mm) (see component of FIG. 5) are compared with each other, and the suitable result is selected among the two results, resulting in an improved recognition rate and accuracy.

The entire disclosure of Japanese Patent Application No. 8-95770 filed on Apr. 18, 1996, including specification, claims, drawings, and summary are incorporated herein by reference in its entirety.

Although the present invention has been fully described in connection with the preferred embodiments, thereof, with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting method for use with an electronic component mounting apparatus for mounting an electronic component to a board, the electronic component mounting method comprising:

sucking the electronic component by a suction nozzle;

acquiring image data of the electronic component through recognition of the electronic component sucked by the suction nozzle;

concurrently processing the image data with a plurality of algorithms for detecting postures of components and generating a plurality of posture results;

comparing the plurality of posture results with features of the electronic component stored in the electronic component mounting apparatus;

selecting a posture result from the plurality of posture results;

determining a corrected mounting position of the electronic component based on the selected posture result; and mounting the electronic component to the board using the corrected mounting position.

2. The electronic component mounting method, as defined in claim 1, wherein said comparing of the plurality of posture results includes comparing the plurality of posture results with geometric features of the electronic component stored in the electronic component mounting apparatus.

3. The electronic component mounting method, as defined in claim 2, wherein said selecting of the posture result includes:

comparing a first area value of the component obtained from the geometric features of the electronic component stored in the electronic component mounting apparatus with area values obtained from each of the plurality of posture results; and selecting one of the plurality of posture results as the selected posture result based on which of the area values obtained from each of the plurality of posture results has an area value closest to the first area value.

4. The electronic component mounting method, as defined in claim 2, wherein said selecting of the posture result includes:

comparing a first outline length of the component obtained from the geometric features of the electronic component stored in the electronic component mounting apparatus with outline lengths obtained from each of the plurality of posture results; and selecting one of the plurality of posture results as the selected posture result based on which of the outline lengths obtained from each of the plurality of posture results has an outline length closest to the first outline length.

5. An electronic component mounting apparatus for mounting an electronic component on a board, the electronic component mounting apparatus comprising:

a suction nozzle operable to suck the electronic component;

a camera operable to recognize the electronic component sucked by said suction nozzle and thus acquire image data of the electronic component; and a control unit operable to process the image data concurrently with a plurality of algorithms for detecting postures of components and generating a plurality of posture results, wherein said control unit:

compares the plurality of posture results with features of the electronic component stored in the electronic component mounting apparatus, selects a posture result from the plurality of posture results, determines a corrected mounting position of the electronic component based on the selected posture result, and controls a mounting of the electronic component on the board using the corrected mounting position.

6. The electronic component mounting apparatus, as defined in claim 5, wherein the features of electronic component comprise geometric features.

7. The electronic component mounting apparatus, as defined in claim 5, wherein said control unit selects the posture result by:

comparing a first area value of the component obtained from the features of the electronic component stored in the electronic component mounting apparatus with area values obtained from each of the plurality of posture results; and selecting one of the plurality of posture results as the selected posture result based on which of the area values obtained from each of the plurality of posture results has an area value closest to the first area value.

8. The electronic component mounting apparatus, as defined in claim 5, wherein said control unit selects the posture result by:

comparing a first outline length of the component obtained from the features of the electronic component stored in the electronic component mounting apparatus with outline lengths obtained from each of the plurality of posture results; and selecting one of the plurality of posture results as the selected posture result based on which of the outline lengths obtained from each of the plurality of posture results has an outline length closest to the first outline length.

9. An electronic component mounting apparatus for mounting an electronic component on a board, the electronic component mounting apparatus comprising:

a device for sucking the electronic component;

a device for recognizing the electronic component sucked by said device for sucking and thus acquiring image data of the electronic component; and a control means for concurrently processing the image data with a plurality of algorithms for detecting postures of components and generating a plurality of posture results, wherein said control means:

compares the plurality of posture results with features of the electronic component stored in the electronic component mounting apparatus, selects a posture result from the plurality of posture results, determines a corrected mounting position of the electronic component based on the selected posture result, and controls a mounting of the electronic component on the board using the corrected mounting position.

10. The electronic component mounting apparatus, as defined in claim 9, wherein the features of electronic component comprise geometric features.

11. The electronic component mounting apparatus, as defined in claim 9, wherein said control means selects the posture result by:

comparing a first area value of the component obtained from the features of the electronic component stored in the electronic component mounting apparatus with area values obtained from each of the plurality of posture results; and selecting one of the plurality of posture results as the selected posture result based on which of the area values obtained from each of the plurality of posture results has an area value closest to the first area value.

12. The electronic component mounting apparatus, as defined in claim 9, wherein said control means selects the posture result by:

comparing a first outline length of the component obtained from the features of the electronic component stored in the electronic component mounting apparatus with outline lengths obtained from each of the plurality of posture results; and selecting one of the plurality of posture results as the selected posture result based on which of the outline lengths obtained from each of the plurality of posture results has an outline length closest to the first outline length.

* * * * *